(12) United States Patent
Xu et al.

(10) Patent No.: US 8,093,715 B2
(45) Date of Patent: Jan. 10, 2012

(54) ENHANCEMENT OF THERMAL INTERFACE CONDUCTIVITIES WITH CARBON NANOTUBE ARRAYS

(75) Inventors: Jun Xu, Shanghai (CN); Timothy S. Fisher, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 1528 days.

(21) Appl. No.: 11/462,452

(22) Filed: Aug. 4, 2006

(65) Prior Publication Data

US 2011/0007477 A1    Jan. 13, 2011

Related U.S. Application Data

(60) Provisional application No. 60/706,203, filed on Aug. 5, 2005.

(51) Int. Cl.
*H01L 21/48* (2006.01)
*H01L 23/48* (2006.01)

(52) U.S. Cl. ........... 257/720; 257/E21.11; 257/E23.098; 257/E23.101; 257/E23.105; 257/E25.011; 438/122; 977/742; 977/762

(58) Field of Classification Search ................... 257/720, 257/E23.098, E23.101, E23.105, E25.011, 257/E21.11; 438/122; 977/742, 762
See application file for complete search history.

(56) References Cited

U.S. PATENT DOCUMENTS

| | | | | |
|---|---|---|---|---|
| 5,230,924 | A * | 7/1993 | Li | 427/229 |
| 7,431,964 | B2 * | 10/2008 | Wei et al. | 427/191 |
| 2003/0117770 | A1 | 6/2003 | Montgomery et al. | |
| 2003/0231471 | A1 | 12/2003 | De Lorenzo et al. | |
| 2004/0184241 | A1 | 9/2004 | De Lorenzo et al. | |
| 2004/0261987 | A1 | 12/2004 | Zhang et al. | |
| 2004/0265489 | A1 | 12/2004 | Dubin | |

(Continued)

FOREIGN PATENT DOCUMENTS

EP    1329953    12/2002

(Continued)

OTHER PUBLICATIONS

"An Analytical Study of Transport in a Thermal Interface Material Enhanced With Carbon Nanotubes"; The Ninth Intersociety Conference on Thermal and Thermomechanical Phenomena in Electronic Systems; 2004; pp. 403-409, vol. 1; Published by IEEE; Piscataway, NJ, USA.

(Continued)

*Primary Examiner* — Asok Sarkar
(74) *Attorney, Agent, or Firm* — Hartman & Hartman, P.C.; Gary M. Hartman; Domenica N. S. Hartman (57) ABSTRACT

A method of forming a well-anchored carbon nanotube (CNT) array, as well as thermal interfaces that make use of CNT arrays to provide very high thermal contact conductance. A thermal interface is formed between two bodies by depositing a continuous array of carbon nanotubes on a first of the bodies so that, on mating the bodies, the continuous array is between surface portions of the first and second bodies. The thermal interface preferably includes a multilayer anchoring structure that promotes anchoring of the continuous array of carbon nanotubes to the first body. The anchoring structure includes a titanium bond layer contacting the surface portion of the first body, and an outermost layer with nickel or iron catalytic particles from which the continuous array of carbon nanotubes are nucleated and grown. Additional thermal interface materials (TIM's) can be used in combination with the continuous array of carbon nanotubes.

22 Claims, 6 Drawing Sheets

U.S. PATENT DOCUMENTS

| | | | |
|---|---|---|---|
| 2005/0046017 A1* | 3/2005 | Dangelo | 257/720 |
| 2005/0129928 A1 | 6/2005 | Lee et al. | |
| 2005/0224220 A1 | 10/2005 | Li et al. | |
| 2005/0260412 A1* | 11/2005 | Gardner | 428/408 |
| 2006/0141153 A1 | 6/2006 | Kubota et al. | |

FOREIGN PATENT DOCUMENTS

| | | |
|---|---|---|
| WO | WO03107419 | 12/2003 |

OTHER PUBLICATIONS

"Nanoscale Heat Transfer and Nanostructured Thermoelectrics"; The Ninth Intersociety Conference on Thermal and Thermomechanical Phenomena in Electronic Systems; 2004; pp. 8-17; vol. 1; Published by IEEE; Piscataway, NJ, USA.

"Carbon Nanotube Coatings for Thermal Control"; The Ninth Intersociety Conference on Thermal and Thermomechanical Phenomena in Electronic Systems; 2004; pp. 297-301; vol. 1; Published by IEEE; Piscataway, NJ, USA.

Jun Xu, T.S. Fisher; "Enhanced Thermal Contact Conductance Using Carbon Nanotube Arrays"; Ninth Intersociety Conference on Thermal and Thermomechanical Phenomena in Electronic Systems, Jun. 1, 2004; Las Vegas, NV, USA.

Cruden Brett A et al: Reactor design considerations in the hot filament/direct current plasma synthesis of carbon nanofibers Journal of Applied Physics, American Institute of Physics. New York, US, vol. 94, No. 6, Sep. 15, 2003, pp. 4070-4078, XP012060222, ISSN: 0021-8979.

* cited by examiner

ENHANCEMENT OF THERMAL INTERFACE CONDUCTIVITIES WITH CARBON NANOTUBE ARRAYS

CROSS REFERENCE TO RELATED APPLICATIONS

This application claims the benefit of U.S. Provisional Application No. 60/706,203, filed Aug. 5, 2005, the contents of which are incorporated herein by reference.

BACKGROUND OF THE INVENTION

The present invention generally relates to thermal interfaces across which heat is transferred. More particularly, this invention relates to the enhancement of heat transfer across a thermal interface through the inclusion of carbon nanotubes.

Reduction of interfacial thermal resistance remains a major challenge in the thermal management of many heat-generating engineered components and systems, including the chip-package interface of semiconductor devices, for example, a power integrated circuit (IC) and a heat sink or substrate. Thermal contact resistance exists at interfaces because of imperfections caused by microscopic asperities between contacting surfaces. Thermal interface materials (TIM's), such as solders, thermal greases, oils, gels and pastes, phase change materials (PCM's), and sheet-type solid materials, have been developed to reduce contact resistance. TIM's are generally more compliant than the contacting surfaces themselves, and tend to displace air gaps under the application of pressure to increase the extent of contact, thereby increasing thermal contact conductance. Some PCM's have achieved interfacial resistances of approximately 5 mm$^2$K/W.

With flowable thermal interface materials, high thermal interface conductance is often achieved through enhanced spreadability and elasticity to fill the microscopic gaps between the interface surfaces. As a result of thermal fluctuations, during which the viscosity of a flowable TIM decreases with increasing temperature, nonuniform thermal expansion and deformation of the interface surfaces under a given thermal load can cause "pumping out" of the TIM from the outer edges of the interface. This phenomenon eventually causes part of the interface to dry out and results in dramatically increased thermal contact resistance.

In addition to those noted above, carbon fiber-based thermal interface composites have also been proposed, notable examples of which include TIM's containing carbon nanotubes (CNT's). As known in the art, CNT's are in the form of cylindrical carbon molecules with diameters less than one micrometer, and can be formed by various processes including chemical vapor deposition (CVD) on fine particles of a transition metal, particularly nickel or iron, that serve as a catalyst. Theory and experiments indicate that individual single-wall carbon nanotubes (SWNT's) and multi-wall carbon nanotubes (MWMT) exhibit extremely high phonon-dominated thermal conductivities of up to about 5000 to 8000 W/mK and 3000 W/mK at room temperature, respectively. The extremely high thermal conductivity of carbon nanotubes suggests many applications in various engineering fields, including electronics packaging. Prior research has indicated that the effective thermal conductivity of an oil containing about one volume percent CNT's is about 2.5 times the value of the base oil. Other research has indicated that an epoxy loaded with about one weight percent unpurified SWNT's exhibits an approximately 70% increase in thermal conductivity at 40K and an approximately 125% increase at room temperature. High thermal conductivity composite materials containing aligned carbon nanotubes for heat-spreading devices (microchannel heat sinks or heat pipes, etc.), have also been proposed.

In view of the above, the use of ultra-high thermal conductivity carbon nanotubes could potentially reduce interfacial resistance by an order of magnitude or more to satisfy the increasing power dissipation challenge. One approach to the use of CNT materials is to deposit CNT's as a coating for a thermal interface surface. For example, U.S. Patent Application Publication Nos. 2003/0231471 and 2004/0184241 each disclose an integrated circuit package having a TIM layer of diamond and a CNT array deposited by a plasma discharge process on a surface of the TIM layer. Another approach involves the use of CNT particles as a filler material to promote the conductivity of a soft TIM, such as a silicone or other polymeric material. Still another approach disclosed in EP1329953 is to deposit CNT bundles on a thermal interface surface, and then apply a soft TIM to the CNT layer. With this approach, the CNT bundles do not appear to form a continuous layer, but instead are spaced apart so that the soft TIM is present between adjacent CNT bundles.

Not withstanding the above-noted advancements, there is an ongoing desire to further improve thermal interface conduction and materials. In particular, as single-chip devices approach and exceed 1 W/mm$^2$, improved thermal management strategies are required to achieve reliable packages for these devices.

BRIEF SUMMARY OF THE INVENTION

The present invention provides a method of forming a well-anchored carbon nanotube (CNT) array, as well as thermal interfaces that make use of CNT arrays to provide very high thermal contact conductance.

According to one aspect of the invention, a thermal interface is formed between at least two bodies, and the thermal interface comprises a continuous array of preferably vertically-oriented carbon nanotubes on a surface portion of at least a first of the bodies so that the continuous array is between the surface portion of the first body and a surface portion of a second of the bodies. According to another aspect of the invention, a thermal interface is formed between at least two bodies by depositing a continuous array of carbon nanotubes on a surface portion of at least a first of the bodies, and then mating the surface portion of the first body with a surface portion of a second of the bodies so that the continuous array of carbon nanotubes is between the surface portions of the first and second bodies. According to an additional aspect of the invention, a thermal interface body comprises a multilayer anchoring structure on a surface portion of the body, and a continuous array of carbon nanotubes on the anchoring structure. The anchoring structure comprises a titanium bond layer contacting the surface portion of the body, an outermost layer with nickel or iron catalytic particles, and an optional aluminum layer between the titanium bond layer and the outermost layer for promoting the formation of the catalytic particles. The continuous array of carbon nanotubes are nucleated and grown from the catalytic particles on the surface portion of the body.

The above aspects of the invention are believed to provide a number of advantages, depending on the characteristics of the thermal interfaces in which they are used. For example, the continuous array of carbon nanotubes can be used as the sole thermal interface material within a thermal interface, providing a dry contact between contact surfaces with very high thermal contact conductance. Alternatively, the continuous array of carbon nanotubes can be used in combination with a solid or flowable thermal interface material (TIM). If used with a flowable TIM, the well-anchored CNT array has been unexpectedly found to inhibit the pumping out effect to which the flowable TIM is subject to improve the interface performance and life by maintaining a continuous layer of the flowable TIM of desirable thickness, even under high pressure, high temperature, and load cycling. The inclusion of a well-anchored CNT array is also believed to increase the effective thermal contact conductance of the thermal interface. Finally, a dramatic improvement in the performance of carbon nanotube arrays as a TIM is believed to be attributable to the multilayer anchoring structure, and particularly the innermost titanium layer that is believed to provide a stronger bond that promotes a more efficient heat-flow path at the interfaces between the substrate and individual CNT's.

Other objects and advantages of this invention will be better appreciated from the following detailed description.

DETAILED DESCRIPTION OF THE INVENTION

The present invention provides the capability for thermal interface materials (TIM's) with significantly improved performance, and particularly the performance of carbon nanotubes (CNT's) as a TIM. According to one preferred aspect of the invention, performance enhancement is achieved in part with the use of multiple metal layers that, in addition to providing the required surface catalysis for the nanotube growth process, form an anchoring structure that improves the bond with the CNT's manifested by a more efficient heat-flow path at the CNT-substrate interface. According to another preferred aspect of the invention, performance enhancement is achieved by synthesizing the CNT's to ensure that a dense, vertically-oriented array forms, as opposed to randomly oriented CNT's or isolated bundles of CNT's. Such a CNT array can be combined with a solid or flowable TIM, which in the latter case the CNT array reduces the tendency for the flowable TIM to be pumped out from between a pair of interface surfaces, with the result that improved interface performance and life can be achieved.

Figure 1:
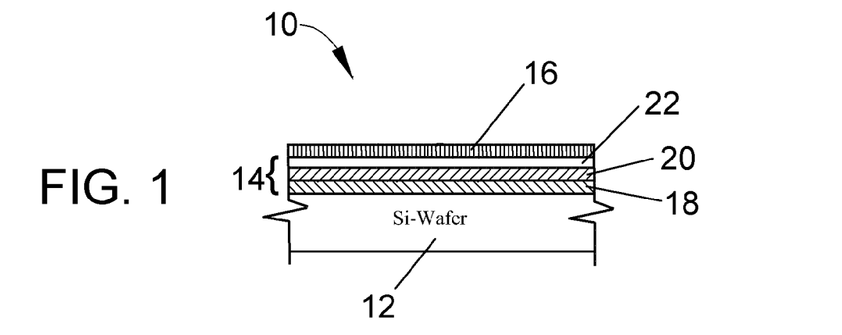
FIG. 1 schematically represents a dense, well-anchored, vertically-oriented CNT array on an anchoring structure in accordance with an embodiment of the present invention.

FIG. 1 schematically represents an article 10 comprising a substrate 12, a well-anchored CNT array 16, and a layered anchoring structure 14 preferably used in the production of the well-anchored CNT array 16 in accordance with an embodiment of the invention. The article 10 may be a heat-generating component, including but not limited to a power integrated circuit (IC), or a heat sink or substrate into which heat is conducted from a heat-generating component, including but not limited to a heat sink or substrate contacted by a power IC. The substrate 12 can be formed of essentially any material, including silicon and particularly single crystal silicon for use in semiconductor applications. In FIG. 1, the anchoring structure 14 is represented by three metal layers 18, 20, and 22. The outermost layer 22 is a transition metal, preferably nickel (Ni) or iron (Fe), of suitable thickness so that, as known in the art, the layer 22 aggregates into small particles under suitable annealing conditions to provide catalytic sites for carbon nanotube nucleation and growth. As reported below, as-deposited Ni/Fe layers 22 having thicknesses of about 6 nm and about 10 nm have been successfully used in the present invention, though those skilled in the art will appreciate that lesser and greater thicknesses are also suitable and therefore within the scope of this invention. An aluminum (Al) layer 20 may be provided beneath the Ni/Fe layer 22 to promote the formation of the desired fine catalytic Ni/Fe particles under annealing conditions during growth of the CNT array 16. However, the aluminum layer 20 is optional in the anchoring structure 14 of the present invention. In practice, aluminum layers 20 having thicknesses of about 10 nm and about 20 nm have been successfully used, though those skilled in the art will appreciate that lesser and greater thicknesses are also suitable and therefore within the scope of this invention. The innermost layer 18 is a titanium (Ti) layer that, in investigations leading to this invention, was determined to promote a stronger bond between the underlying substrate 12 and the anchoring structure 14 (and therefore also the CNT array 16). As reported below, titanium layers 18 having thicknesses of about 10 nm and about 30 nm have been successfully used in the practice of this invention, though those skilled in the art will appreciate that lesser and greater thicknesses would be practical and therefore also within the scope of this invention. The metallic layers 18, 20, and 22 can be deposited on the substrate 12 by a variety of techniques, including sputtering, evaporation, laser deposition, or electrodeposition. Anchoring structures 14, both with and without the optional aluminum layer 20, have been shown to exhibit a favorable active catalyst effect for growth of CNT arrays 16 on a variety of substrates, including silicon.

While a variety of CNT deposition techniques could be used, well-anchored CNT arrays 16 within the scope of this invention have been directly synthesized on the anchoring structure 14 using microwave plasma enhanced chemical vapor deposition (PECVD). Compared with other deposition techniques, a wide range of parameters can be varied in PECVD processes that are believed capable of optimizing the thermal properties of the synthesized CNT's. It is also well known that PECVD is advantageous to well aligned nanotube growth at low temperatures. Further, the addition of plasma energy to the CVD process may improve the quality (or purity) and controllability of the resulting nanostructures. CNT arrays 16 with average thicknesses of about 7 to about 20 micrometers have been successfully produced on the anchoring structure 14 described above, though those skilled in the art will appreciate that lesser and greater thicknesses are also possible and therefore within the scope of this invention. According to a preferred aspect of the invention, in addition to being well anchored as a result of the anchoring structure 14, the CNT array 16 is preferably a dense and continuous forest of vertically-oriented CNT's (i.e., perpendicular to the surface of the anchoring structure 14). The CNT array is continuous in that it is not made up of isolated bundles of CNT's but instead has a uniform CNT coverage of at least about 80%, more preferably at least 90%, and ideally 100%. Aside from these attributes, the individual CNT's are generally similar to individual CNT's produced by previous methods.

In a first series of investigations leading to this invention, heat-conduction interfaces provided with well-anchored CNT arrays as described above were fabricated and experimentally studied. Arrays of mat-type carbon nanotube layers were grown directly on silicon substrates by microwave PECVD. In the PECVD system used in the investigation, a DC bias voltage of about 100V was applied to some substrates. The bias was used to promote the flow of ions to the substrate and effectively vertically orient the CNT's by inducing anisotropic etching of misaligned nanotubes. Thus, PECVD offered the possibility of achieving the purity exhibited by high-temperature synthesis and uniform films of well-aligned, vertically-oriented CNT arrays, while retaining the controllability inherent to CVD processes.

Copper and single crystal silicon were selected as two representative substrate materials for the investigation. Double-side-polished silicon wafers were diced into 10 mm by 10 mm chips, and the native oxide layer was removed. Nickel and iron were the catalysts used as the outermost layer (22 in FIG. 1) of the anchoring structure 14 on which CNT synthesis would occur. The size, shape, and chemical composition of catalyst particles have been shown to have significant effects on CNT synthesis. In forming the anchoring structure 14, one surface of a double-side-polished wafer was first coated with an approximately ten nanometer-thick titanium layer 18, on which an approximately twenty nanometer-thick layer 20 of aluminum was deposited. The surface of the aluminum layer 20 was then coated with a layer 22 of the active catalyst metal, either iron or nickel, deposited to a thickness of about ten nanometers.

Figure 2:
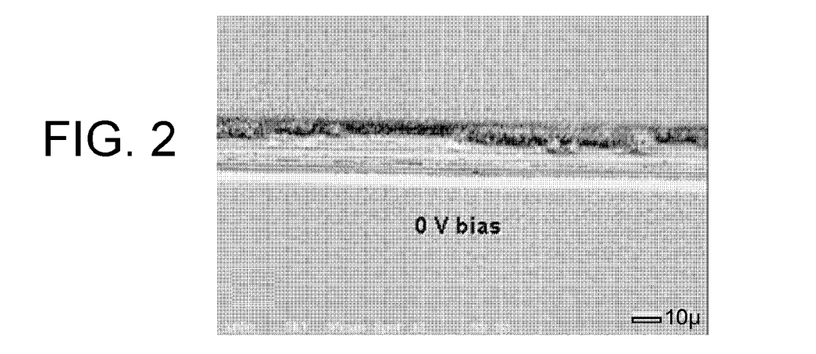
FIGS. 2 and 3 are scanned SEM images of CNT arrays synthesized without and with, respectively, a DC substrate bias voltage.
Figure 3:
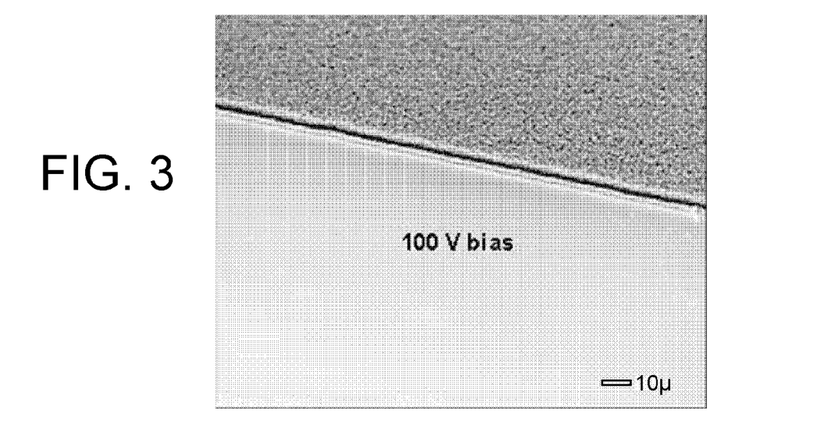
Figure 4:
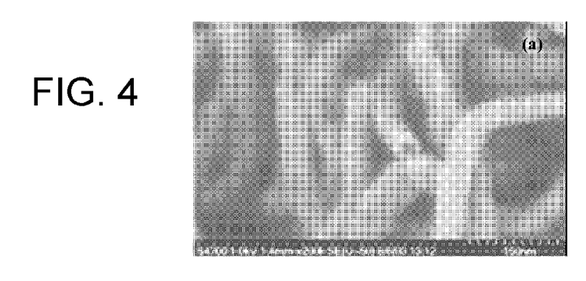
FIGS. 4 and 5 are higher magnification SEM and TEM images, respectively, of the sample shown in FIG. 3.
Figure 5:
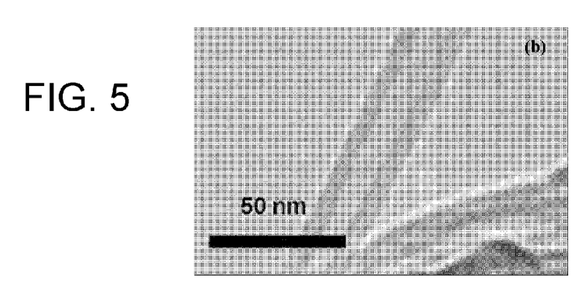

Following an anneal at about 800° C. for about ten to thirty minutes, CNT arrays 16 were deposited using nominal PECVD operating conditions including a pressure of about 5 to about 10 torr with feed gases of $H_2$ and $CH_4$ at flow rates of about 50 SCCM and about 3 to 10 SCCM, respectively. FIG. 2 is a SEM image of a CNT array synthesized without DC substrate bias voltage. FIG. 3 is a SEM image showing the synthesis result of applying a 100V substrate bias. The other growth parameters for the two samples shown in FIGS. 2 and 3 were an anneal temperature of about 800° C., a pressure of about 10 torr, feed gas of about 2 to 3% $CH_4$, 125 W microwave plasma power, and five minutes growth time. FIGS. 4 and 5 are high magnification SEM and TEM images, respectively, for the sample shown in FIG. 3. Individual carbon nanotubes and the wall structure of the nanotubes are clearly visible in FIGS. 4 and 5. The typical diameter for the synthesized nanotubes was about 20 nm for this sample, and the average length of the nanotubes was about 7 micrometers. In general, the Ti/Al/Fe anchoring structures exhibited better anchoring of CNT's to the substrate than the Ti/Al/Ni anchoring structures.

Figure 6:
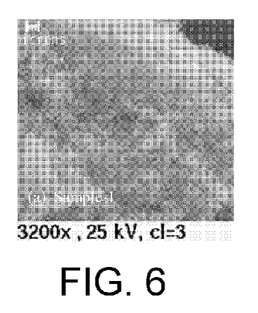
FIGS. 6, 7, and 8 are scanned SEM images of three samples of CNT arrays synthesized in accordance with the invention for use in an interfacial contact resistance test.
Figure 7:
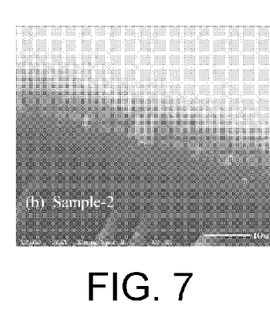
Figure 8:
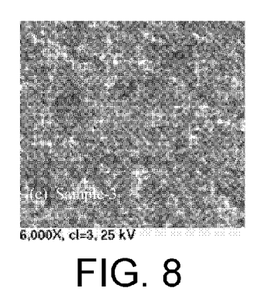

Three samples prepared as above were evaluated with a reference calorimeter experimental setup for measurement of interfacial contact conductance based on 1-D steady-state heat conduction. The test equipment and procedure will not be described in any detail here, but are reported in a paper authored by the inventors of the present invention, entitled "Enhanced Thermal Contact Conductance Using Carbon Nanotube Arrays," ITherm 2004; Ninth Intersociety Conference on Thermal and Thermomechanical Phenomena in Electronic Systems, Las Vegas Nev., USA. FIGS. 6, 7, and 8 are SEM images of the samples. Sample 1 of FIG. 6 was a Ni-catalyzed CNT-coated specimen with approximate 60% CNT coverage. FIGS. 7 and 8 are SEM images of Fe-catalyzed CNT-coated specimens (Samples 2 and 3, respectively) with approximately 90% and 80% CNT coverage, respectively. The CNT synthesis parameters for the samples are summarized in Table 1 below.

TABLE 1

| | Sample 1 | Sample 2 | Sample 3 |
|---|---|---|---|
| Thickness of Wafer (μm) | 380 | 270 | 380 |
| Catalyst | Ni | Fe | Fe |
| Temperature (° C.) | 800 | 800 | 800 |
| Pressure (torr) | 10 | 10 | 5 |
| $CH_4$ flow rate (SCCM) | 10 | 1.5 | 5 |
| $H_2$ flow rate (SCCM) | 40 | 50 | 45 |
| Microwave power (W) | 500 | 125 | 125 |
| Bias (V) | 0 | 100 | 0 |
| Growth time (minutes) | 20 | 5 | 20 |

Figure 9:
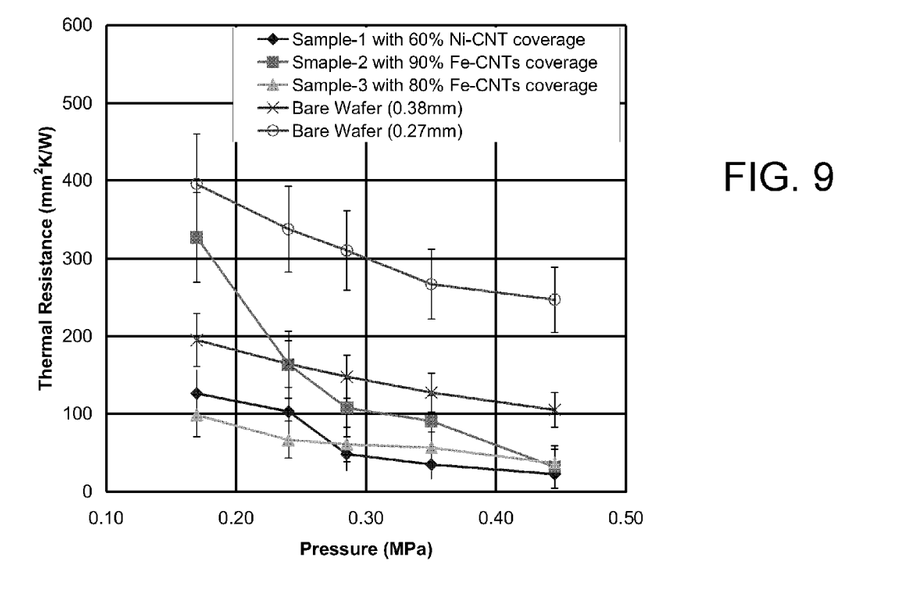
FIG. 9 is a graph plotting contact resistance as a function of interface pressure for interfaces with and without CNT arrays of this invention.

Temperature distributions at thermal interfaces formed by the deposited CNT arrays and copper bars were measured by an infrared thermal imaging system. FIG. 9 is a graph plotting contact resistance as a function of interface pressure for the copper-CNT array interfaces, as well as test results of contact resistances for thermal interfaces formed by copper bars and bare wafers. Experimental uncertainty was dominated by the magnitude of the temperature gradient (G) and its measurement accuracy, with larger values of G producing less uncertainty. Using standard error estimation approaches, the estimated uncertainties of the measurements ranged from 20 to 50 $mm^2K/W$ and are indicated in graphical results as error bars.

Figure 10:
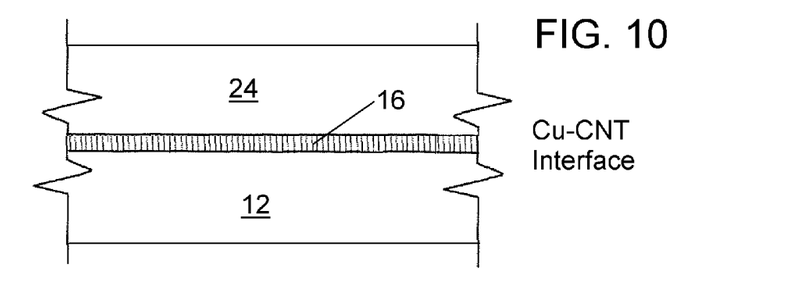
FIG. 10 schematically represents a thermal interface formed by two opposing surfaces, only one of which is coated with a dense, well-anchored, vertically-oriented CNT array in accordance with an embodiment of this invention.
Figure 11:
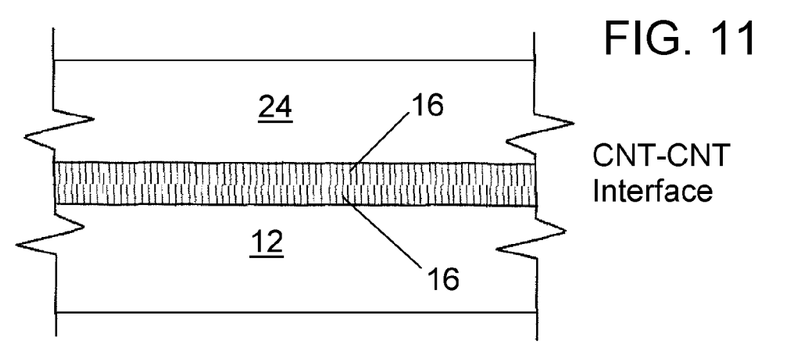
FIG. 11 schematically represents a thermal interface formed by two opposing surfaces, both of which are coated with dense, well-anchored, vertically-oriented CNT arrays in accordance with an embodiment of this invention.

As evident from FIG. 9, interface resistance decreased as the pressure increased for all specimens tested. The three samples with different CNT synthesis parameters exhibited different pressure-resistance characteristics. Sample 2 displayed the strongest pressure dependence, and all samples exhibited similar resistances at the highest pressure. A large resistance drop occurred at a pressure of about 0.285 MPa for Sample 1. Sample 3 exhibited lower resistances under lower pressures compared to the other samples. It is hypothesized that differences in pressure dependence may have been the result of differences in array composition, such that shorter CNT's did not bridge gaps between the silicon and copper substrates until sufficient deformation occurred. At a pressure of about 0.445 MPa, the resistances were approximately 23 $mm^2K/W$, 32 $mm^2K/W$, and 37 $mm^2K/W$ for Samples 1, 2 and 3, respectively. Though these values were relatively high compared to results that have been obtained with PCM TIM's, the results of this investigation was deemed to be very promising. First, because of the somewhat non-uniform CNT coverage of the samples (i.e., less than 100%), the local interface resistances could have been lower than the reported overall values. Second, the growth parameters had not been optimized to improve the local area density of the CNT's. Further, the height of the CNT's might have been too short for the peak-to-valley amplitudes of the copper surfaces. Nonetheless, the well-anchored CNT arrays of this invention are believed to provide the following benefits and features. The anchoring structure 14, including the titanium layer 18 to improve anchoring of the structure 14 to the substrate 12, yields a well-anchored CNT array 16 capable of use as a thermal interface material (TIM). A well-anchored CNT array 16 can be deposited as the sole thermal interface material on one of two interface substrates 12 and 24, such that the array 16 contacts the bare (CNT-free) surface of the second substrate 24 as schematically represented in FIG. 10. Alternatively as schematically represented in FIG. 11, well-anchored CNT arrays 16 can be deposited on both opposing interface substrates 12 and 24 such that the arrays 16 contact each other to yield a high thermal conductivity interface. The surface of each substrate 12 and 24 can be reconstructed as necessary to regrow well-anchored CNT arrays 16.

Figure 12:
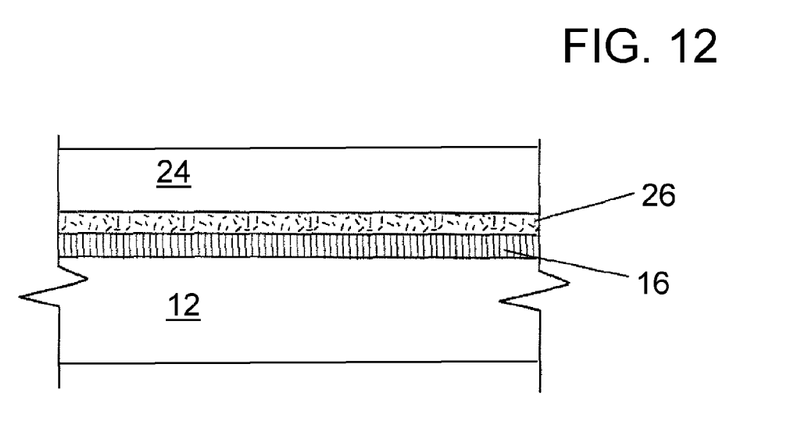
FIG. 12 schematically represents a thermal interface formed by two opposing surfaces, one of which is coated with a dense, well-anchored, vertically-oriented CNT array of this invention and the second of which is provided with a solid TIM in accordance with an embodiment of this invention.
Figure 13:
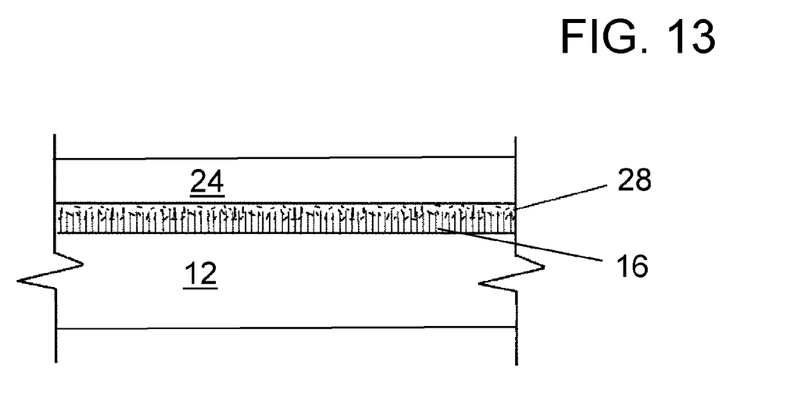
FIG. 13 schematically represents a thermal interface formed by two opposing surfaces, one of which is coated with a dense, well-anchored, vertically-oriented CNT array and the second of which is provided with a flowable TIM to form a composite TIM in accordance with an embodiment of this invention.

Though the resistance results were one to two orders of magnitude lower that those of carbon fiber composite materials with and without thermal gel or grease, the application of a second TIM was postulated as being capable of enhancing the thermal contact conductance of a well-anchored CNT array 16 as compared to the dry condition. As a result, the well-anchored CNT arrays of this invention in combinations with additional TIM's were proposed for further thermal contact conductance reduction. FIG. 12 schematically represents a well-anchored CNT array 16 of this invention in combination with a solid TIM 26, such as a thin sheet of indium or another conductive solid material, and FIG. 13 schematically represents a well-anchored CNT array 16 of this invention in combination with a flowable TIM 28, such as a thermal grease, thermal oil, thermal gel, phase change material (PCM), etc. Prior to mating the two substrates 12 and 24 represented in FIGS. 12 and 13, the anchoring structure 14 and CNT array 16 of FIG. 1 can be deposited on one of the substrates 12 and the additional TIM 26 or 28 applied or deposited on the remaining substrate 24, with the result that the CNT array 16 intimately contacts the TIM 26/28. In addition to the well-anchored CNT arrays improving the effective cross-layer thermal conductivity of the resulting composite formed by the CNT arrays 16 and the secondary TIM's 26 and 28 at the thermal interface, the combination of a dense vertically-oriented CNT array 16 and a flowable TIM 28 (FIG. 13) was unexpectedly shown to inhibit the pump-out effect typically observed with flowable TIM's. As such, the inclusion of the continuous CNT array 16 is believed to be capable of improving the performance and life of thermal interfaces in which a flowable TIM is used. Based on an investigation reported below, it is believed that a continuous, vertically-oriented CNT array 16 is able to maintain within a thermal interface a continuous layer of a highly flowable TIM with negligible thickness loss, even when subjected to high pressures (e.g., above 0.5 MPa), high temperatures, and load cycling.

Figure 14:
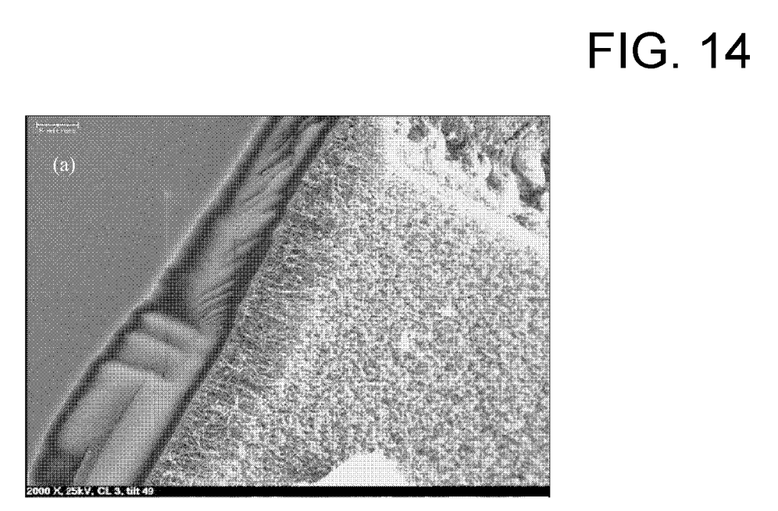
FIGS. 14 and 15 are scanned SEM images showing perspective and sectional views of a dense, well-anchored, vertically-oriented CNT array.
Figure 15:
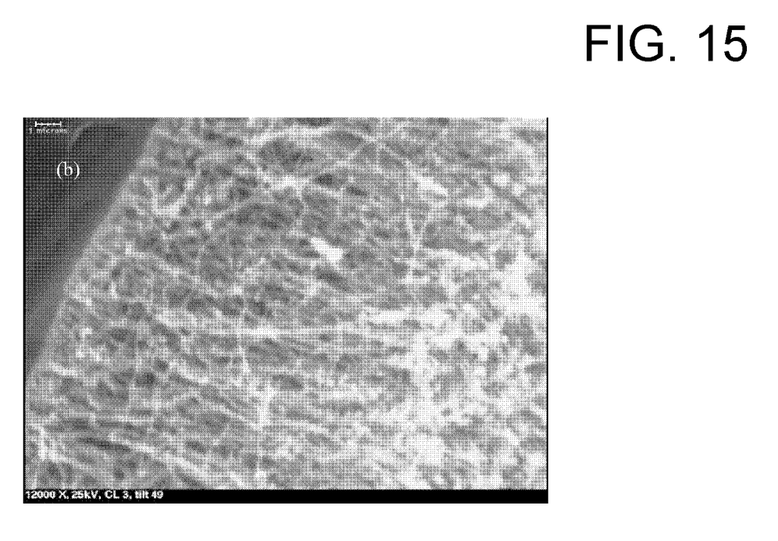

In the following investigations, well-anchored CNT arrays of the type described above were directly synthesized on silicon wafers by microwave PECVD. The CNT arrays were deposited on anchoring structures formed by an innermost titanium layer, an intermediate aluminum layer, and an outermost nickel layer having thicknesses of about 30, 10, and 6 nm, respectively. The CNT arrays were deposited using the following nominal PECVD operating conditions: pressure of about 10 torr, anneal temperature of about 800° C., and feed gases of $H_2$ and $CH_4$ with flow rates of about 50 SCCM and about 3 to 10 SCCM, respectively. The synthesized samples had approximately 100% CNT coverage. FIGS. 14 and 15 are scanned SEM images showing the structure of one of the CNT arrays. In FIG. 14, the CNT array can be seen as made up of a dense and continuous forest of vertically oriented CNT's. The array also appears to possess a uniform layer thickness, generally about 10 to about 15 micrometers. The higher magnification of FIG. 15 shows the detailed structure of the array. The layer thickness of the section shown in FIG. 15 was estimated to be about 15 micrometers, and the CNT's are seen to be of the multiwall type with an average diameter of approximately 20 nm.

In this investigation, thermal contact resistances of thermal interfaces formed by a copper substrate mated with CNT arrays on a silicon wafer (Cu-CNT-Si) were examined, along with interfaces formed by copper and bare (CNT-free) silicon wafers with either an indium sheet (Cu—In—Si) or PCM (Cu-PCM-Si) therebetween as control experiments. The indium sheets had thicknesses of about 370 micrometers, and the PCM was a compound commercially available under the name PCM45 from Honeywell. Furthermore, combinations of indium sheet-CNT (Cu—In/CNT-Si) and PCM-CNT (Cu-PCM/CNT-Si) were also tested to evaluate possible enhancements of interface conductance. Steady-state contact conductance measurements were performed on the thermal interfaces consistent with the experimental setup used in the previous described investigation. To reduce heat losses and experimental uncertainty, testing was performed in a high-vacuum environment with radiation shielding, and temperature measurements were made with an infrared camera.

Figure 16:
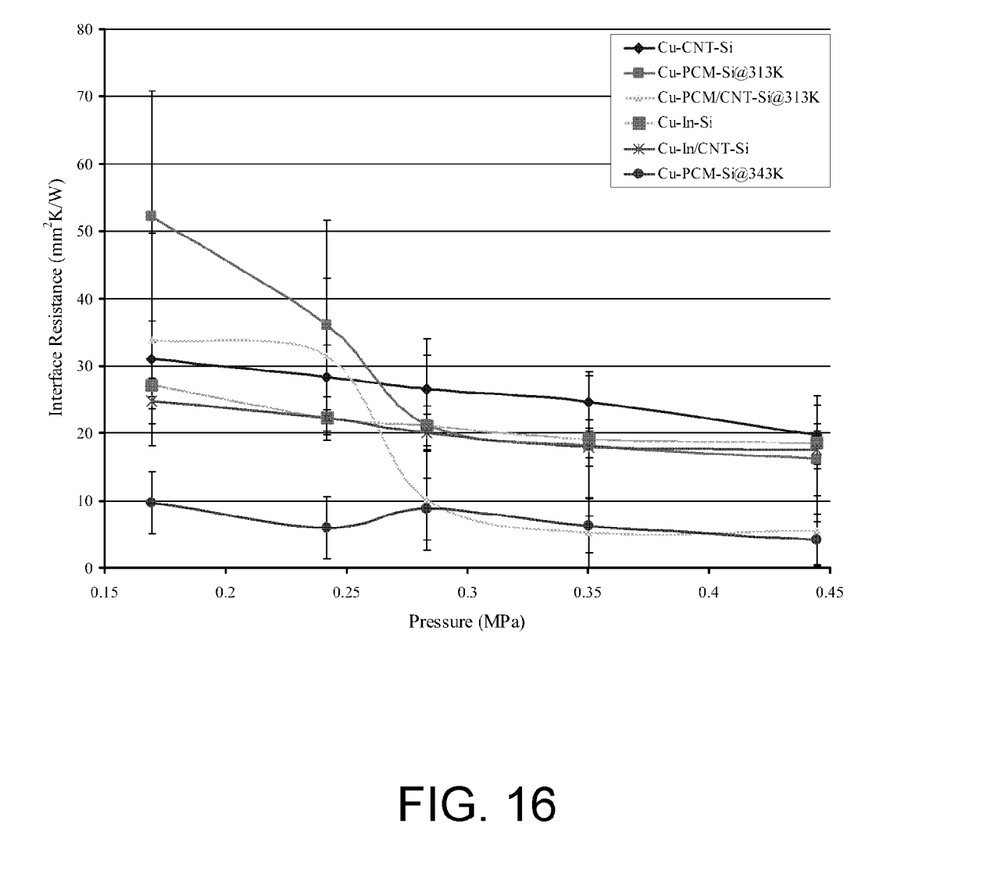
FIG. 16 is a graph plotting contact resistance as a function of interface pressure for interfaces with and without CNT arrays of this invention and with and without solid or flowable TIM's.

The thermal contact conductance measurements of the above interface configurations are presented in FIG. 16 as a function of interface pressure. In general, interface resistance decreased as pressure increased for all cases. The CNT array samples showed a significant enhancing effect in most cases. Under the testing loads, the resistances for the copper-CNT array interface were less than 31 $mm^2K/W$, and the lowest value was about 19.8 $mm^2K/W$ at a pressure of about 0.445 MPa. The experiments with the PCM45 material showed a strong temperature dependence. Initially, to avoid degassing, testing was conducted at a relatively low heat flux. With a nominal interface temperature of about 313K (40° C.), the measured resistances of the Cu-PCM-Si interface ranged from about 52.2 to about 16.2 $mm^2K/W$. At the same interface temperature, the addition of CNT's (Cu-PCM/CNT-Si) significantly reduced the resistance. The two configurations exhibited similar pressure-resistance characteristics with lower resistances for increasing load. The resistances stabilized for pressures larger than 0.28 MPa. For the Cu-PCM/CNT-Si combination, the lowest measured resistance value was about 5.2 $mm^2K/W$ at a pressure of about 0.35 MPa. At a vacuum level of about $10^{-5}$ torr, the Cu-PCM-Si interface was re-tested under the high heat flux. With a nominal interface temperature of about 343K (70° C.), this thermal interface exhibited the lowest thermal resistances among the tested interfaces, with values ranging from about 9.3 to about 4.7 $mm^2K/W$.

The above investigation showed that the indium sheet was a good thermal interface material with lower pressure dependence. The measured resistance of the Cu—In—Si interface ranged from about 27.2 to about 18.5 $mm^2K/W$. Testing of the Cu—In/CNT-Si specimen indicated that the addition of the CNT array reduced interface resistance, but the reduction was lower than the tested combination of a CNT array and PCM. This result may have been because the indium sheet remained as a solid at the test temperature, and the indium sheet and CNT array did not form a composite structure.

On the basis of the above investigation, it was concluded that dense, well-anchored, vertically-oriented CNT arrays can be very good thermal interface materials under moderate load compared to metal foils and PCM-type TIM's. Furthermore, the inclusion of CNT arrays at a thermal interface containing another TIM can improve thermal contact conductance performance beyond that possible with the other TIM alone.

In a final investigation, additional samples of well-anchored CNT arrays were mated with copper bars on which the PCM45 material was applied to a thickness of about 200 micrometers at room temperature with slight pressure applied to ensure air was not trapped between the PCM and copper surface. After a delay of about one hour to ensure the PCM was fully attached, the PCM-coated surfaces of the copper bars were mated with CNT-coated silicon substrates. A large pressure load of about 0.5 MPa was then applied while temperature was increased to about 348K (75° C.), which far exceeded the melting point of the PCM. As the temperature increased and the PCM began to melt, the PCM between the copper bar and bare silicon wafer was easily squeezed out by the high pressure at the thermal interface, while only a very small amount of the PCM was squeezed out from the thermal interface that included the CNT array. Once the structures stabilized, the final thicknesses of the PCM layers were measured. The thickness of the PCM layer mated with the CNT array had not changed significantly, with a final layer thickness of more than 170 micrometers. In contrast, under the same pressure load and temperature conditions, the interface containing only the PCM layer had a final PCM thickness of only about 16 micrometers. From previous experience, a thin PCM of only 16 micrometers would be prone to the pump-out phenomenon when subjected to thermal cycling.

On the basis of these results, it was concluded that a flowable TIM (such as a PCM, thermal gel, thermal grease, thermal oil, etc.) supplemented with a dense, vertically-oriented CNT array can maintain a continuous desirable thickness under high pressure, high temperature, and load cycling, and that the pumping out effect can be greatly inhibited.

While the invention has been described in terms of specific embodiments, it is apparent that other forms could be adopted by one skilled in the art. For example, the physical configuration of the CNT arrays and the substrates on which they are deposited can differ from that shown, and materials and processes other than those noted could be use. Therefore, the scope of the invention is to be limited only by the following claims.

The invention claimed is:

1. A thermal interface between at least two bodies, the thermal interface comprising:
   a continuous array of carbon nanotubes on a surface portion of at least a first of the bodies so as to be between the surface portion of the first body and a surface portion of a second of the bodies; and
   a multilayer anchoring structure on the surface portion of the first body, the multilayer anchoring structure comprising an outermost layer with nickel or iron catalytic particles from which the continuous array of carbon nanotubes nucleated and grew, a titanium bond layer contacting the surface portion of the first body to promote a more efficient heat-flow path at interfaces between the first body and individual carbon nanotubes, and an optional aluminum layer between the titanium bond layer and the outermost layer for promoting the formation of the catalytic particles.

2. The thermal interface according to claim 1, wherein the carbon nanotubes are oriented substantially perpendicular to the surface portion of the first body.

3. The thermal interface according to claim 1, wherein the carbon nanotubes are present on the surface portion of the first body to provide a coverage of at least 80% between the surface portions of the first and second bodies.

4. The thermal interface according to claim 1, wherein the carbon nanotubes are present on the surface portion of the first body to provide a coverage of about 100% between the surface portions of the first and second bodies.

5. The thermal interface according to claim 1, further comprising a second continuous array of carbon nanotubes on the surface portion of the second body so as to be between the continuous array of carbon nanotubes on the surface portion of the first body and the surface portion of the second body.

6. The thermal interface according to claim 1, further comprising a solid thermal interface material on the surface portion of the second body so as to be between and contacting the continuous array of carbon nanotubes on the surface portion of the first body and the surface portion of the second body.

7. The thermal interface according to claim 1, further comprising a flowable thermal interface material on the surface portion of the second body so as to be between and contacting the continuous array of carbon nanotubes on the surface portion of the first body and the surface portion of the second body, wherein the carbon nanotubes are sufficiently continuous within the continuous array so as to inhibit a pumping-out effect that would occur during thermal cycling to cause the flowable thermal interface material to migrate out from between the first and second bodies.

8. The thermal interface according to claim 1, wherein the multilayer anchoring structure does not comprise the optional aluminum layer between the titanium bond layer and the outermost layer.

9. The thermal interface according to claim 1, wherein the outermost layer is nickel.

10. The thermal interface according to claim 1, wherein the first and second bodies comprise a power integrated circuit device and a heat sink.

11. A method of forming the thermal interface of claim 1, the method comprising:
    forming the multilayer anchoring structure on the surface portion of the first body;
    depositing the continuous array of carbon nanotubes on the multilayer anchoring structure; and then
    mating the surface portion of the first body with the surface portion of the second body so that the continuous array of carbon nanotubes is between the surface portions of the first and second bodies.

12. The method according to claim 11, wherein the carbon nanotubes are deposited to be oriented substantially perpendicular to the surface portion of the first body.

13. The method according to claim 11, wherein the carbon nanotubes are present on the surface portion of the first body to provide a coverage of at least 80% between the surface portions of the first and second bodies.

14. The method according to claim 11, wherein the carbon nanotubes are present on the surface portion of the first body to provide a coverage of about 100% between the surface portions of the first and second bodies.

15. The method according to claim 11, further comprising depositing a second continuous array of carbon nanotubes on the surface portion of the second body so as to be between the continuous array of carbon nanotubes on the surface portion of the first body and the surface portion of the second body following the mating step.

16. The method according to claim 11, further comprising applying a solid thermal interface material on the surface portion of the second body so as to be between and contacting the continuous array of carbon nanotubes on the surface portion of the first body and the surface portion of the second body following the mating step.

17. The method according to claim 11, further comprising applying a flowable thermal interface material on the surface portion of the second body so as to be between and contacting the continuous array of carbon nanotubes on the surface portion of the first body and the surface portion of the second body following the mating step, wherein the carbon nanotubes are sufficiently continuous within the continuous array so as to inhibit a pumping-out effect that would occur during thermal cycling to cause the flowable thermal interface material to migrate out from between the first and second bodies.

18. The method according to claim 11, wherein the multi-layer anchoring structure does not comprise the optional aluminum layer between the titanium bond layer and the outermost layer.

19. The method according to claim 11, wherein the outermost layer is nickel.

20. The method according to claim 11, wherein the depositing step is performed by plasma-enhanced chemical vapor deposition.

21. The method according to claim 20, wherein the depositing step is performed while a DC bias voltage is applied to the first body, the DC bias voltage being sufficient to promote vertical orientation of the carbon nanotubes relative to the surface portion of the first body.

22. The method according to claim 21, wherein the DC bias voltage is about 100V.

* * * * *